(12) United States Patent
Lius (10) Patent No.: US 10,572,747 B2
(45) Date of Patent: Feb. 25, 2020

(54) DISPLAY APPARATUS

(71) Applicant: InnoLux Corporation, Miao-Li County (TW)

(72) Inventor: Chandra Lius, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 116 days.

(21) Appl. No.: 15/713,754

(22) Filed: Sep. 25, 2017

(65) Prior Publication Data

US 2018/0349719 A1 Dec. 6, 2018

Related U.S. Application Data

(60) Provisional application No. 62/512,733, filed on May 31, 2017, provisional application No. 62/527,198, filed on Jun. 30, 2017.

(51) Int. Cl.
| | |
|---|---|
| *G06K 9/00* | (2006.01) |
| *G02F 1/1333* | (2006.01) |
| *G02F 1/1335* | (2006.01) |
| *G06K 9/20* | (2006.01) |
| *H01L 27/32* | (2006.01) |

(52) U.S. Cl.
CPC ... *G06K 9/00885* (2013.01); *G02F 1/133514* (2013.01); *G02F 1/133617* (2013.01); *G06K 9/2018* (2013.01); *G02F 1/1333* (2013.01); *G02F 1/13338* (2013.01); *G02F 2001/133614* (2013.01); *G02F 2201/52* (2013.01); *G02F 2202/36* (2013.01); *G06K 9/00006* (2013.01); *G06K 9/00013* (2013.01); *G06K 9/00053* (2013.01); *H01L 27/3211* (2013.01); *H01L 27/3225* (2013.01)

(58) Field of Classification Search
CPC ............. G06K 9/00885; G06K 9/2018; G06K 9/00006; G06K 9/00013; G06K 9/00053; G02F 1/133617; G02F 1/133514; G02F 1/1333; G02F 2202/36; G02F 2201/52; G02F 2001/133614; G02F 1/13338; H01L 27/3211; H01L 27/3225
See application file for complete search history.

(56) References Cited

U.S. PATENT DOCUMENTS

| | | | | |
|---|---|---|---|---|
| 2012/0242635 | A1* | 9/2012 | Erhart | G06F 1/1626 345/207 |
| 2017/0371461 | A1* | 12/2017 | Lee | G06K 9/00 |
| 2017/0372110 | A1* | 12/2017 | Uehara | G06F 3/041 |
| 2018/0225503 | A1* | 8/2018 | Kim | G06K 9/00046 |
| 2018/0341290 | A1* | 11/2018 | Sim | G06F 1/1643 |

\* cited by examiner

*Primary Examiner* — Jon Chang
(74) *Attorney, Agent, or Firm* — Bacon & Thomas, PLLC (57) ABSTRACT

A display apparatus is disclosed, which includes: a display panel; a first adhesive layer disposed on the display panel; a cover layer disposed on the first adhesive layer; and a biometric sensor disposed between the first adhesive layer and the cover layer.

18 Claims, 10 Drawing Sheets

DISPLAY APPARATUS

CROSS REFERENCE TO RELATED APPLICATION

This application claims the benefit of filing dates of U.S. Provisional Application Ser. Nos. 65/512,733 and 62/527,198, respectively filed May 31 and Jun. 30, 2017 under 35 USC § 119(e)(1).

BACKGROUND

1. Field

The present disclosure relates to a display apparatus and, more particularly, to a display apparatus with a biometric sensor.

2. Description of Related Art

With the continuous advancement of technologies related to displays, all the display apparatuses are now developed toward compactness, thinness, and lightness. This trend makes thin displays, such as liquid crystal display devices, organic light-emitting diode display devices and inorganic light-emitting diode display devices, replacing cathode-ray-tube displays as the mainstream display devices on the market. Applications of thin displays are numerous. Most electronic products for daily use, such as mobile phones, notebook computers, video cameras, still cameras, music displays, mobile navigators, and TV sets, employ such display panels.

Nowadays, the display apparatuses are required to have not only the display function but also other functions such as touch or identification functions. Hence, how to integrate the biometric sensor into the display apparatus without reducing the accuracy or the resolution of the biometric sensor and also without destroying the aesthetic point of the display apparatus is one issue that should be solved.

SUMMARY

The display apparatus of the present disclosure includes: a display panel; a first adhesive layer disposed on the display panel; a cover layer disposed on the first adhesive layer; and a biometric sensor disposed between the first adhesive layer and the cover layer.

Other novel features of the disclosure will become more apparent from the following detailed description when taken in conjunction with the accompanying drawings.

DETAILED DESCRIPTION OF EMBODIMENT

The following embodiments when read with the accompanying drawings are made to clearly exhibit the above-mentioned and other technical contents, features and effects of the present disclosure. Through the exposition by means of the specific embodiments, people would further understand the technical means and effects of the present disclosure. Moreover, as the contents disclosed herein should be readily understood and can be implemented by a person skilled in the art, all equivalent changes or modifications which do not depart from the concept of the present disclosure should be encompassed by the appended claims.

Furthermore, the ordinals recited in the specification and the claims such as "first", "second" and so on are intended only to describe the elements claimed and imply or represent neither that the claimed elements have any proceeding ordinals, nor that sequence between one claimed element and another claimed element or between steps of a manufacturing method. The use of these ordinals is merely to differentiate one claimed element having a certain designation from another claimed element having the same designation.

Furthermore, the ordinals recited in the specification and the claims such as "above", "over", or "on" are intended not only directly contact with the other substrate or film, but also intended indirectly contact with the other substrate or film.

In addition, the features in different embodiments of the present disclosure can be mixed to form another embodiment.

Embodiment 1

Figure 1A:
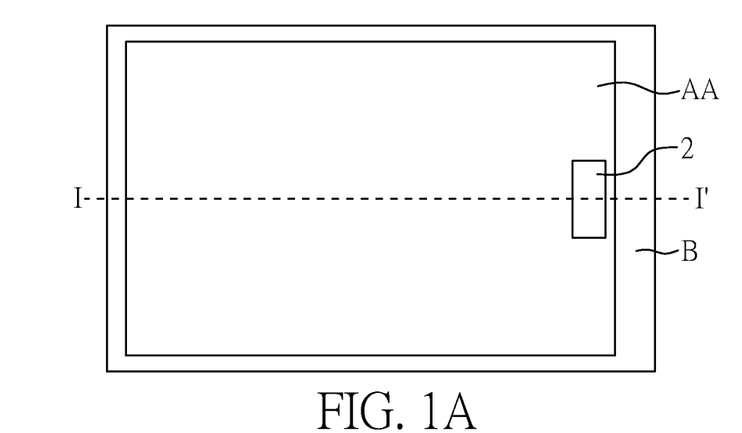
FIG. 1A is a plan view of a display apparatus according to Embodiment 1 of the present disclosure.
Figure 1B:
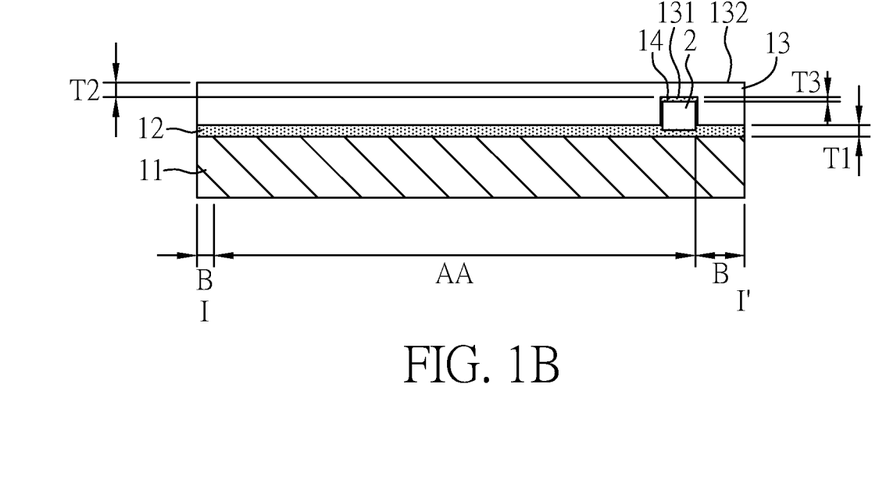
FIG. 1B is a cross-sectional view of a display apparatus according to Embodiment 1 of the present disclosure.

FIG. 1A is a plan view of a display apparatus according to the present embodiment, and FIG. 1B is a cross-sectional view of the display apparatus along the line I-I' indicated in FIG. 1A.

As shown in FIG. 1B, the present embodiment provide a display apparatus, which comprises: a display panel 11; a first adhesive layer 12 disposed on the display panel 11; a cover layer 13 disposed on the first adhesive layer 12; and a biometric sensor 2 disposed between the first adhesive layer 12 and the cover layer 13. Herein, the display panel 11 is adhered to the cover layer 13 by the first adhesive layer 12. In addition, the cover layer 13 protects the display panel 11 from external force and can be any suitable material such as glass, sapphire, ceramic or quartz, but the present disclosure is not limited thereto.

In the present embodiment, the cover layer 13 includes a recess portion 131, and at least a part of the biometric sensor 2 can be embedded in the recess portion 131. Herein, a part of the biometric sensor 2 is embedded in the recess portion 131, and another part of the biometric sensor 2 is embedded in the first adhesive layer 12. Because the first adhesive layer 12 cover the biometric sensor 2, the first adhesive layer 12 can further support the biometric sensor 2 disposed beneath the recess portion 131. In addition, the first adhesive layer 12 may have a first thickness T1 in a range from 10 μm to 200 μm to provide enough adhesion strength between the display panel 11 and the cover layer 13 as well as between the biometric sensor 2 and the display panel 11. It should be noted that the two end points 10 μm and 200 μm are included in the range of the first thickness T1.

In addition, the cover layer 13 has a second thickness T2 corresponding to the recess portion 131. The second thickness T2 is in a range from 30 μm to 300 μm. Because the biometric sensor 2 is placed beneath the recess portion 131 and the thickness of the recess portion 131 is thinner than other part of the cover layer 13, the biometric sensor 2 would have lower noise influence or signal distortion, and thus the higher resolution of the biometric sensor 2 can be achieved.

As shown in FIG. 1A and FIG. 1B, the display panel 11 includes an active substrate (not shown in the figure, but capable of referring to the active substrate 111 shown in FIG. 7), and the active substrate (not shown in the figure, but capable of referring to the active substrate 111 shown in FIG. 7) includes a display area AA and a non-display area B adjacent to the display area AA. The active substrate 111 can be a flexible substrate or a rigid substrate. The flexible substrate can be made of any suitable flexible material such as polyimide, polycarbonate, or polyethylene terephthalate. The display area AA refers to a region of the active substrate 111 which is occupied by an array of display elements. The display elements are able to control the light emitted from the display panel 11. The display elements can be pixel electrodes in a non-self emissive display or light emitting diodes in a self emissive display. The non-display area B is the other region of the active substrate which does not belong to the display area AA. As shown in the plan view of FIG. 1A, at least a part of the biometric sensor 2 can overlap the display area AA. In the present embodiment, an object overlapping an area, such as the display area AA or the non-display area B, of the active substrate 111 refers to the object overlapping the area of the active substrate 111 in a predetermined direction. The predetermined direction is set to be perpendicular to the active substrate 111. In more detail, the predetermined direction is perpendicular to a surface of the active substrate 111. In the present embodiment, the biometric sensor 2 overlaps the display area AA. Thus, the purpose that the display apparatus has wide display area can be achieved. However, the present disclosure is not limited thereto; and in some embodiments, the biometric sensor 2 may be disposed on the non-display area B and does not overlap the display area AA.

As shown in FIG. 1B, the display apparatus further comprises a second adhesive layer 14 disposed between the biometric sensor 2 and the cover layer 13. The biometric sensor 2 is adhered to the cover layer 13 by the second adhesive layer 14. The first adhesive layer 12 has a first thickness T1, the second adhesive layer 14 has a third thickness T3, and the first thickness T1 is different from the third thickness T3. The third thickness T3 is in a range from 1 μm to 100 μm. In the present embodiment, the third thickness T3 is less than the first thickness T1, to achieve lower signal distortion or noise effects on the biometric sensor 2.

In the present embodiment, the first adhesive layer 12 and the second adhesive layer 14 can be optically clear, to maintain the amount of the light emitting from the display panel 11. In addition, the first adhesive layer 12 and the second adhesive layer 14 may respectively have a refractive index between 1.41 and 1.51, to match the refractive index of the display panel 11 and the refractive index of the air to keep the transmittance of the display apparatus.

Embodiment 2

Figure 2A:
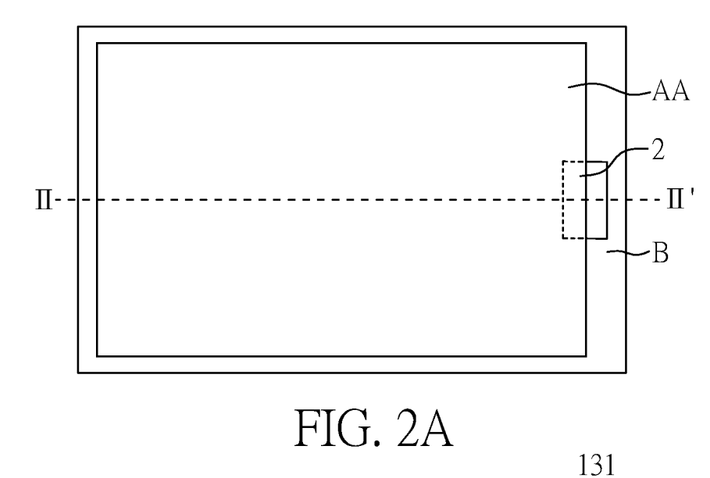
FIG. 2A is a plan view of a display apparatus according to Embodiment 2 of the present disclosure.
Figure 2B:
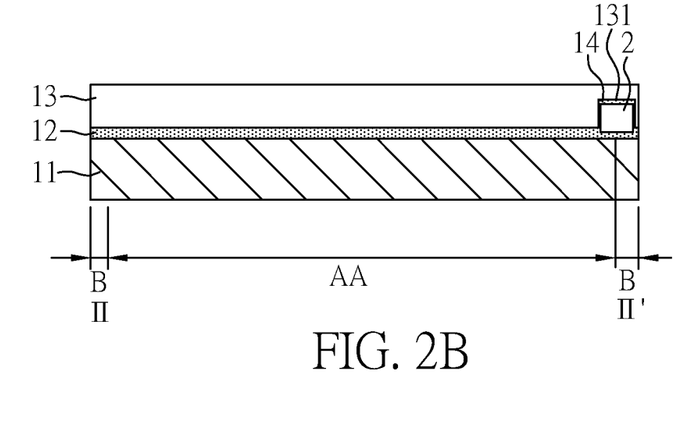
FIG. 2B is a cross-sectional view of a display apparatus according to Embodiment 2 of the present disclosure.

FIG. 2A is a plan view of a display apparatus according to the present embodiment, and FIG. 2B is a cross-sectional view of the display apparatus along the line II-II' indicated in FIG. 2A. The structures of the display apparatuses of Embodiment 1 and the present embodiment are similar, except the following difference.

In Embodiment 1, as shown in FIG. 1A and FIG. 1B, the biometric sensor 2 overlaps the display area AA. In the present embodiment, as shown in FIG. 2A and FIG. 2B, a part of the biometric sensor 2 overlaps the display area AA and the other part of the biometric sensor 2 overlaps the non-display area B. In some embodiments, at least 0.1% to 1.5% of the area of the display area AA overlaps the biometric sensor 2. But the present disclosure is not limited thereto.

Embodiment 3

Figure 3:
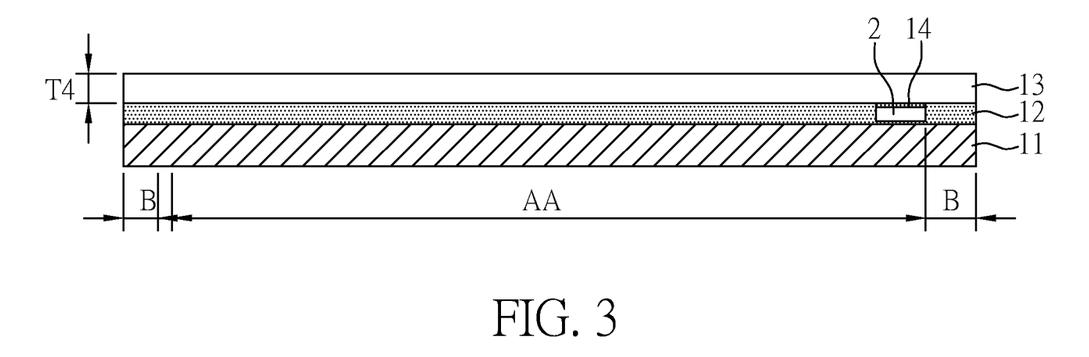
FIG. 3 is a cross-sectional view of a display apparatus according to Embodiment 3 of the present disclosure.

FIG. 3 is a cross-sectional view of a display apparatus according to the present embodiment. The structures of the display apparatuses of Embodiment 1 and the present embodiment are similar, except the following difference.

In Embodiment 1, as shown in FIG. 1B, the cover layer 13 includes a recess portion 131 and at least a part of the biometric sensor 2 is embedded in the recess portion 131. In the present embodiment, as shown in FIG. 3, the cover layer 13 is a plane layer without a recess portion, the biometric sensor 2 is disposed beneath the cover layer 13, and the biometric sensor 2 is embedded in the first adhesive layer 12. Because the cover layer 13 does not have the recess portion, the thickness of the cover layer 13 of the present embodiment is reduced. In this regard, the biometric sensor 2 has lower noise influence, lower signal distortion, or higher resolution. In the present embodiment, the cover layer 13 may have a fourth thickness T4 in a range from 30 μm to 300 μm.

Embodiment 4

Figure 4:
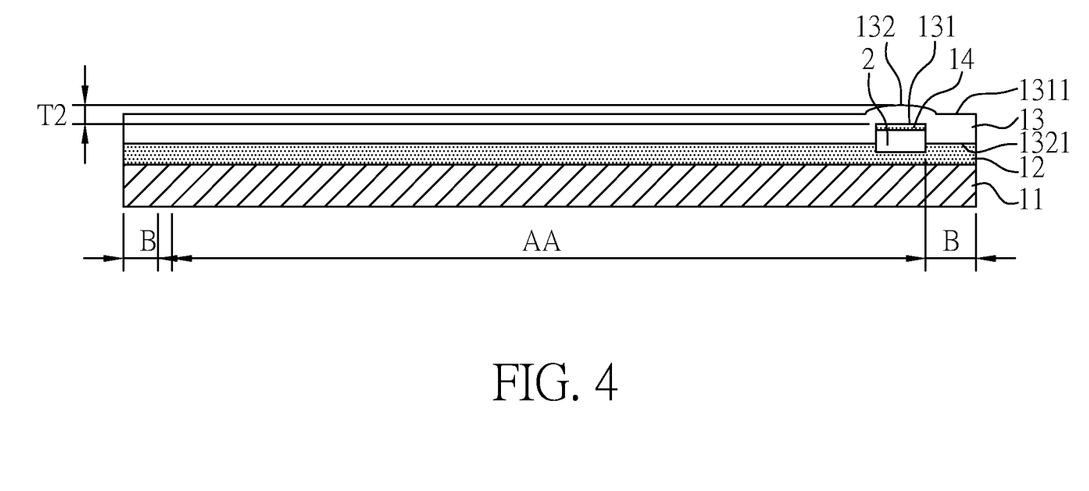
FIG. 4 is a cross-sectional view of a display apparatus according to Embodiment 4 of the present disclosure.

FIG. 4 is a cross-sectional view of a display apparatus according to the present embodiment. The structures of the display apparatuses of Embodiment 1 and the present embodiment are similar, except the following difference.

In Embodiment 1, as shown in FIG. 1B, an outer surface 132 the cover layer 13 is a plane surface. In the present embodiment, as shown in FIG. 4, the cover layer 13 further includes a protruding portion 132 corresponding to the recess portion 131. The protruding portion 132 has a curved surface but is not limited thereto. The protruding portion 132 is disposed at a first side 1311 of the cover layer 13 and the recess portion 131 is disposed at a second side 1321 of the cover layer 13. The first side 1311 is opposite to the second side 1321. The first side 1311 is away from the first adhesive layer 12 while the second side 1321 is near the first adhesive layer 12. Generally, this protruding portion 132 can be used for identifying the location of the biometric sensor 2 while using the display apparatus.

In the foregoing embodiments, the detail structures of the display panels are not disclosed. The following embodiments disclose some possible structures of the display panels. The structures of the display panels shown in the following embodiments may also be applied to the display apparatuses disclosed in the foregoing embodiments.

In addition, in the following embodiments, the display apparatuses having the cover layers with the recess portions are exemplarily disclosed. The display apparatus having the cover layers without the recess portion (for example, as shown in FIG. 3) or with the protruding portion (for example, as shown in FIG. 4) can also be applied to the following embodiments.

Embodiment 5

Figure 5:
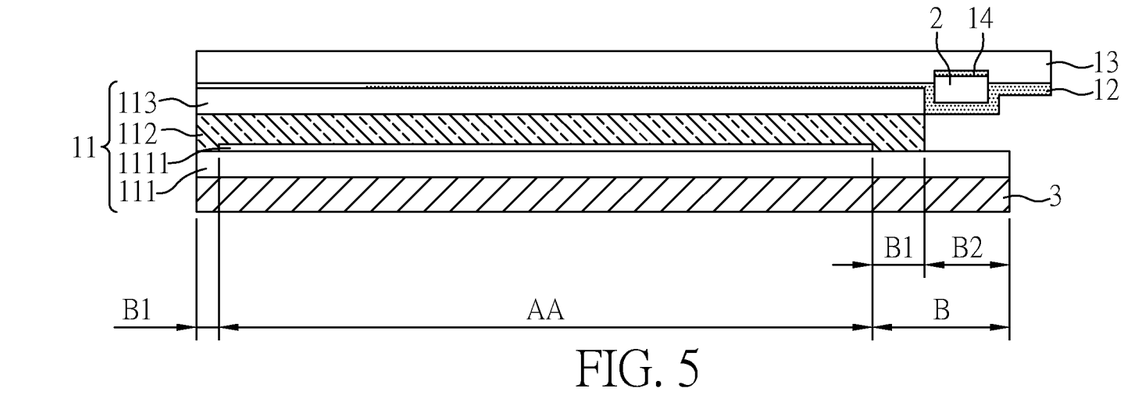
FIG. 5 is a cross-sectional view of a display apparatus according to Embodiment 5 of the present disclosure.

FIG. 5 is a cross-sectional view of a display apparatus according to the present embodiment.

The present embodiment provides a display apparatus, which comprises: a display panel 11; a first adhesive layer 12 disposed on the display panel 11; a cover layer 13 disposed on the first adhesive layer 12; and a biometric sensor 2 disposed between the first adhesive layer 12 and the cover layer 13. In addition, the display apparatus further comprises a second adhesive layer 14 disposed between the biometric sensor 2 and the cover layer 13. The features of the aforementioned elements are already illustrated in the foregoing embodiments in details, and will not be repeated again. Hereinafter, only the features that are not illustrated before are illustrated.

As shown in FIG. 5, the display panel 11 of the present embodiment includes an active substrate 111, and the active substrate 111 includes a display area AA and a non-display area B adjacent to the display area AA. Herein, active units 1111 (for example, thin film transistors) are disposed on the active substrate 111, so the active substrate 111 is also called a thin film transistor (TFT) substrate. In addition, the display panel may further include a counter substrate 113. The counter substrate 113 is disposed opposite to the active substrate 111. Herein, the counter substrate 113 can be a color filter substrate with a color filter layer (not shown in the figure) and a black matrix layer (not shown in the figure) formed thereon. The color filter layer may further include quantum dots (QDs). However, in other embodiments of the present disclosure, the color filter layer (not shown in the figure) can be disposed on the active substrate 111; and in this case, the active substrate 111 is a color filter on array (COA) substrate. Alternatively, the black matrix layer (not shown in the figure) can be disposed on the active substrate 111; and in this case, the active substrate 111 is a black matrix on array (BOA) substrate. Herein, the counter substrate 113 can be a flexible substrate or a rigid substrate. The flexible substrate can be made of any suitable flexible material such as polyimide, polycarbonate, or polyethylene terephthalate. When the active substrate 111 and the counter substrate 113 are prepared by flexible materials, a flexible display apparatus or a curved display apparatus can be obtained. In other embodiments of the present disclosure, for example, when the display panel is an organic light emitting diode (OLED) or an inorganic light emitting diode (LED) display panel, the counter substrate 113 can be an encapsulating layer which is made by inorganic and organic composite layer, such as, the inorganic/organic/inorganic composite layer.

Furthermore, the display panel may further include a display medium 112 disposed between the active substrate 111 and the counter substrate 113. The display medium 112 may comprise liquid crystals (LCs), organic light-emitting diodes (OLEDs), quantum dots (QDs), fluorescence molecules, phosphors, inorganic light-emitting diodes (LEDs), or other display medium; but the present disclosure is not limited thereto.

In the present embodiment, the display medium 112 comprise LCs, and a backlight module 3 may further be disposed under the active substrate 111 to provide light to the display panel 11.

In the present embodiment, the non-display area B includes a first region B1 which overlaps the counter substrate 113 and a second region B2 which does not overlap the counter substrate 113. Herein, at least a part of the biometric sensor 2 may overlap the second region B2. In the present embodiment, the biometric sensor 2 overlaps the second region B2.

Embodiment 6

Figure 6:
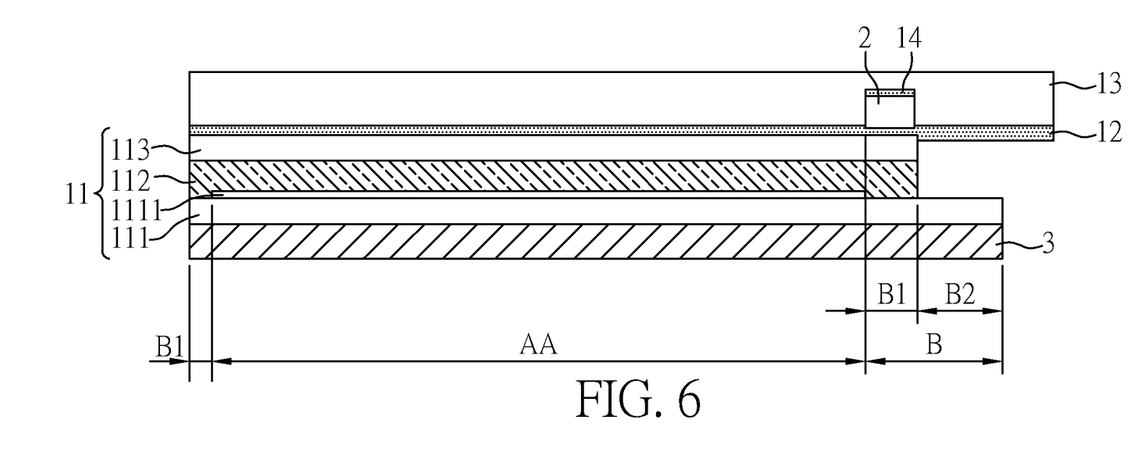
FIG. 6 is a cross-sectional view of a display apparatus according to Embodiment 6 of the present disclosure.

FIG. 6 is a cross-sectional view of a display apparatus according to the present embodiment. The structures of the display apparatuses of Embodiment 5 and the present embodiment are similar, except the following difference.

In Embodiment 5, as shown in FIG. 5, the biometric sensor 2 overlaps the second region B2. In the present embodiment, at least a part of the biometric sensor 2 may overlap the first region B1. As shown in FIG. 6, the biometric sensor 2 overlaps the first region B1. In another embodiment, the biometric sensor may overlap the first region B1 and the second region B2.

Embodiment 7

Figure 7:
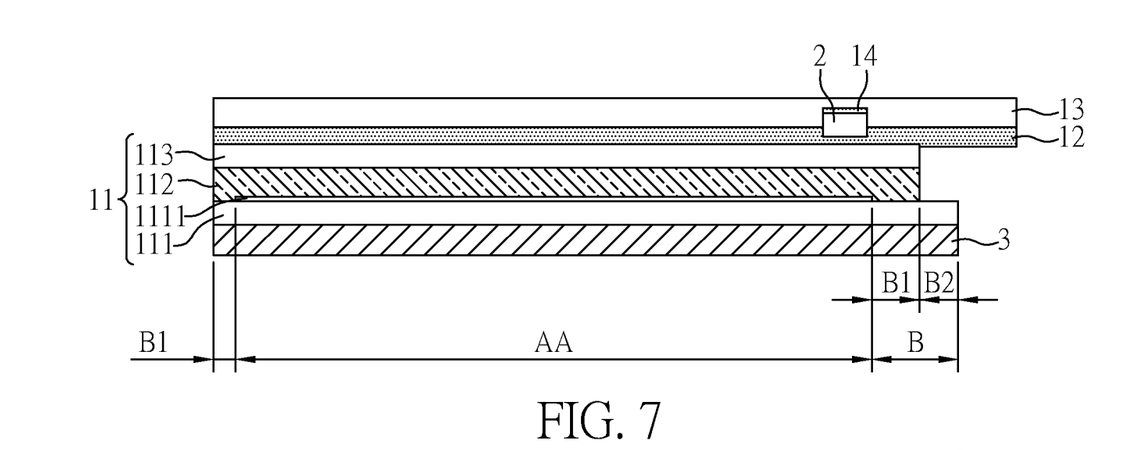
FIG. 7 is a cross-sectional view of a display apparatus according to Embodiment 7 of the present disclosure.

FIG. 7 is a cross-sectional view of a display apparatus according to the present embodiment. The structures of the display apparatuses of Embodiments 5 and 6 and the present embodiment are similar, except the following difference.

In Embodiments 5 and 6, as shown in FIG. 5 and FIG. 6, the biometric sensor 2 overlaps the non-display area B. In the present embodiment, at least a part of the biometric sensor 2 may overlap the display area AA. As shown in FIG. 7, the biometric sensor 2 overlaps the display area AA.

Embodiment 8

Figure 8:
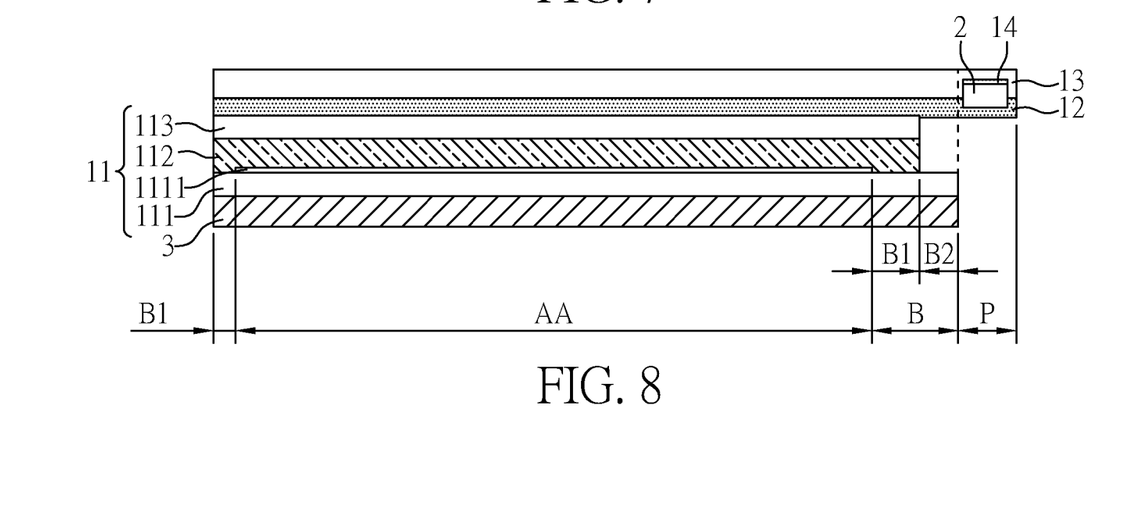
FIG. 8 is a cross-sectional view of a display apparatus according to Embodiment 8 of the present disclosure.

FIG. 8 is a cross-sectional view of a display apparatus according to the present embodiment. The structures of the display apparatuses of Embodiments 5 and 6 and the present embodiment are similar, except the following difference.

In Embodiments 5 and 6, as shown in FIG. 5 and FIG. 6, the biometric sensor 2 overlaps the non-display area B. In the present embodiment, the cover layer 13 includes an extending portion P which does not overlap the display panel 11, and at least a part of the biometric sensor 2 may be disposed on the extending portion P. As shown in FIG. 8, the biometric sensor 2 is disposed on the extending portion P. In the present embodiment, a portion of the cover layer 13 overlapping the display panel 11 refers to the portion of the cover layer 13 overlapping the display panel 11 in a predetermined direction. The predetermined direction is set to be perpendicular to the cover layer 13. In more detail, the predetermined direction is perpendicular to a surface of the cover layer 13.

Embodiment 9

Figure 9:
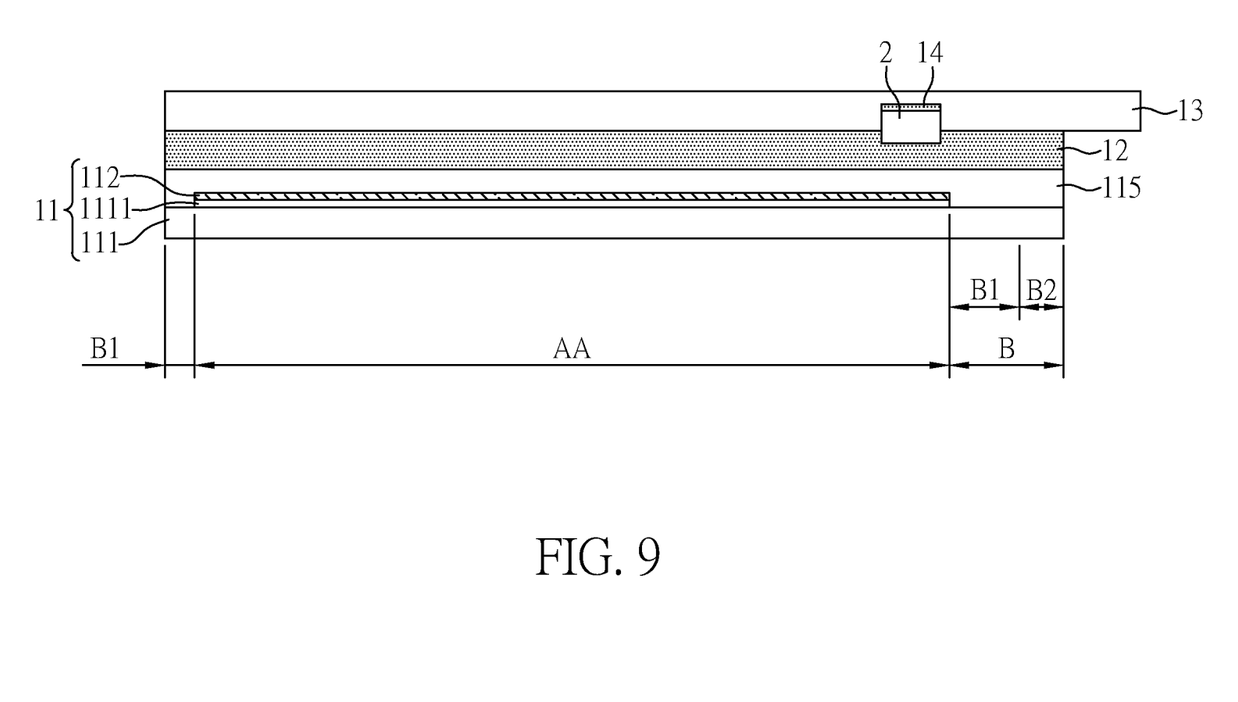
FIG. 9 is a cross-sectional view of a display apparatus according to Embodiment 9 of the present disclosure.

FIG. 9 is a cross-sectional view of a display apparatus according to the present embodiment. The structures of the display apparatuses of Embodiment 7 and the present embodiment are similar, except the following differences.

In Embodiment 7, as shown in FIG. 7, the display apparatus is a liquid crystal display (LCD) apparatus. In the present embodiment, the display apparatus is an OLED display apparatus, wherein the display panel 11 includes an active substrate 111; active units 1111 disposed on the active substrate 111; and a display medium 112 disposed on the active units 1111, wherein the display medium 112 comprises organic light-emitting diodes (OLEDs). In addition, an encapsulating layer 115 is further disposed on the display medium 112.

In the present embodiment, the OLED display apparatus is exemplified. In other embodiments of the present disclosure, other self-emissive display apparatus may also have the structure shown in FIG. 9.

In addition, in the present embodiment, the example that the biometric sensor 2 overlaps the display area AA is illustrated. However, the position of the biometric sensor 2 is not limited thereto. For example, the biometric sensor 2 can be placed at other positions such as those shown in FIG. 5, FIG. 6 and FIG. 8.

In the foregoing embodiments, the integrated circuits for driving the biometric sensors are not shown. The following embodiments disclose some possible arrangements of the integrated circuit for driving the biometric sensor, which may also be applied to the display apparatuses disclosed in the foregoing embodiments.

Embodiment 10

Figure 10:
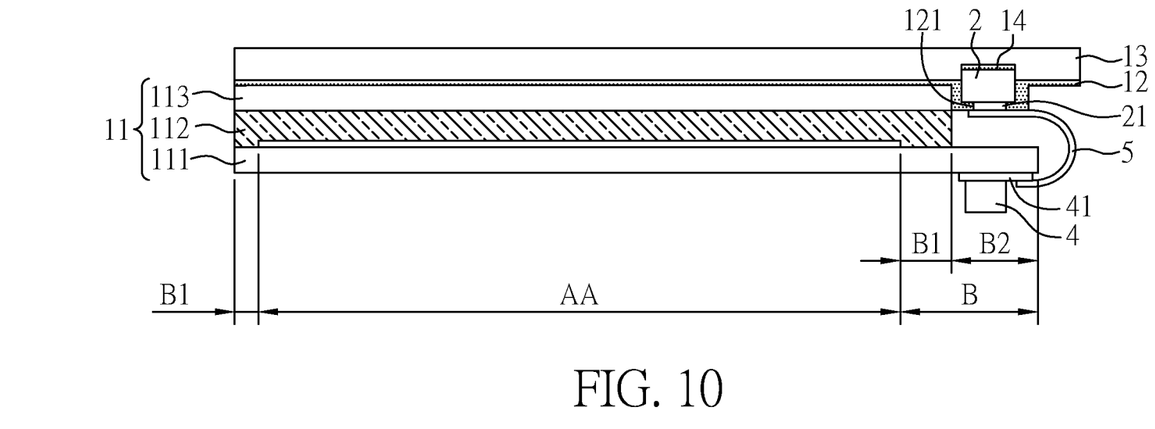
FIG. 10 is a cross-sectional view of a display apparatus according to Embodiment 10 of the present disclosure.

FIG. 10 is a cross-sectional view of a display apparatus according to the present embodiment. The structures of the display apparatuses of Embodiment 5 and the present embodiment are similar, except that the integrated circuit for driving the biometric sensor 2 is not shown in FIG. 5 but is shown in FIG. 10.

In the present embodiment, the display apparatus further comprises: an integrated circuit 4 disposed on the non-display area B. In more detail, the integrated circuit 4 is disposed at a side of the display panel 11 opposite to the cover layer 13, wherein the integrated circuit 4 is electrically connected to the biometric sensor 2. Herein, the integrated circuit 4 can be fixed on the side of the display panel 11 opposite to the cover layer 13 through a conductive adhesive layer 41 such as an anisotropic conductive film (ACF). In other words, the integrated circuit 4 is attached to the non-display area B of the active substrate 111 through the conductive adhesive layer 41. However, the integrated circuit 4 can be directly or indirectly attached to the non-display area B. The first adhesive layer 12 may have an opening 121 to expose a part of the biometric sensor 2. And the first adhesive layer 12 covers another part of the biometric sensor 2. A connector 21 is disposed in the opening 121 and electrically connects to the biometric sensor 2. A flexible printing circuit board 5 electrically connects the conductive adhesive layer 41 and the connector 21. Hence, the integrated circuit 4 is electrically connected to the biometric sensor 2 through the flexible printing circuit board 5. However, the present disclosure is not limited thereto.

In the present embodiment, the display apparatus is a liquid crystal display (LCD) apparatus, a backlight module (not shown in the figure) may be disposed under the display panel 11. For example, a backlight module (not shown in the figure) may be disposed between the active substrate 111 and the integrated circuit 4. Or, the integrated circuit 4 may be disposed between the backlight module and the active substrate 111.

Embodiment 11

Figure 11:
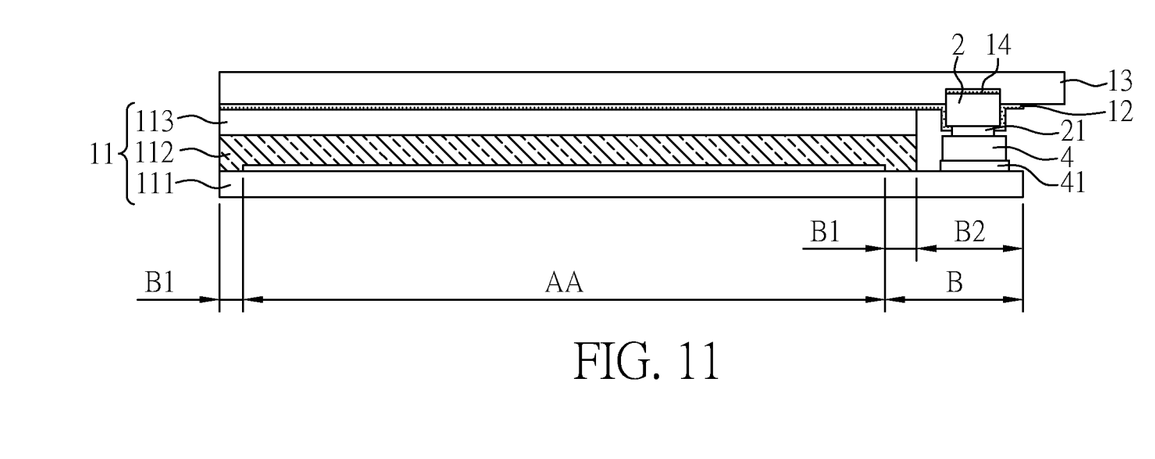
FIG. 11 is a cross-sectional view of a display apparatus according to Embodiment 11 of the present disclosure.

FIG. 11 is a cross-sectional view of a display apparatus according to the present embodiment. The structures of the display apparatuses of Embodiment 10 and the present embodiment are similar, except for the manner for electrically connecting the biometric sensor and the integrated circuit.

In Embodiment 10, as shown in FIG. 10, the integrated circuit 4 is electrically connected to the biometric sensor 2 through the flexible printing circuit board 5. In the present embodiment, as shown in FIG. 11, the display apparatus further comprises an integrated circuit 4 disposed on a side of the active substrate 111 which faces the cover layer 13 and electrically connected to the biometric sensor 2. Herein, a conductive adhesive layer 41 such as an anisotropic conductive film (ACF) is disposed between the integrated circuit 4 and the active substrate 111, so the integrated circuit 4 is electrically connected to active substrate 111 through the conductive adhesive layer 41. And the biometric sensor 2 is electrically connected to the integrated circuit 4 through the connector 21. Or, in another embodiment, the first adhesive layer 12 is conductive, and the biometric sensor 2 is electrically connected to the integrated circuit 4 through the first adhesive layer 12.

In addition, in Embodiments 10 and 11, the example that the biometric sensor 2 overlaps the second region B2 of the non-display area B is illustrated. However, the position of the biometric sensor 2 is not limited thereto. For example, the biometric sensor 2 can be placed at other positions such as those shown in FIG. 6 to FIG. 8.

Furthermore, another integrated circuit (not shown in the figure) for driving the display panel 11 and the integrated circuit 4 for driving the biometric sensor 2 may be separately disposed; or the integrated circuit (not shown in the figure) for driving the display panel 10 and the integrated circuit 4 for driving the biometric sensor 2 can be integrated into one single integrated circuit.

Embodiment 12

Figure 12:
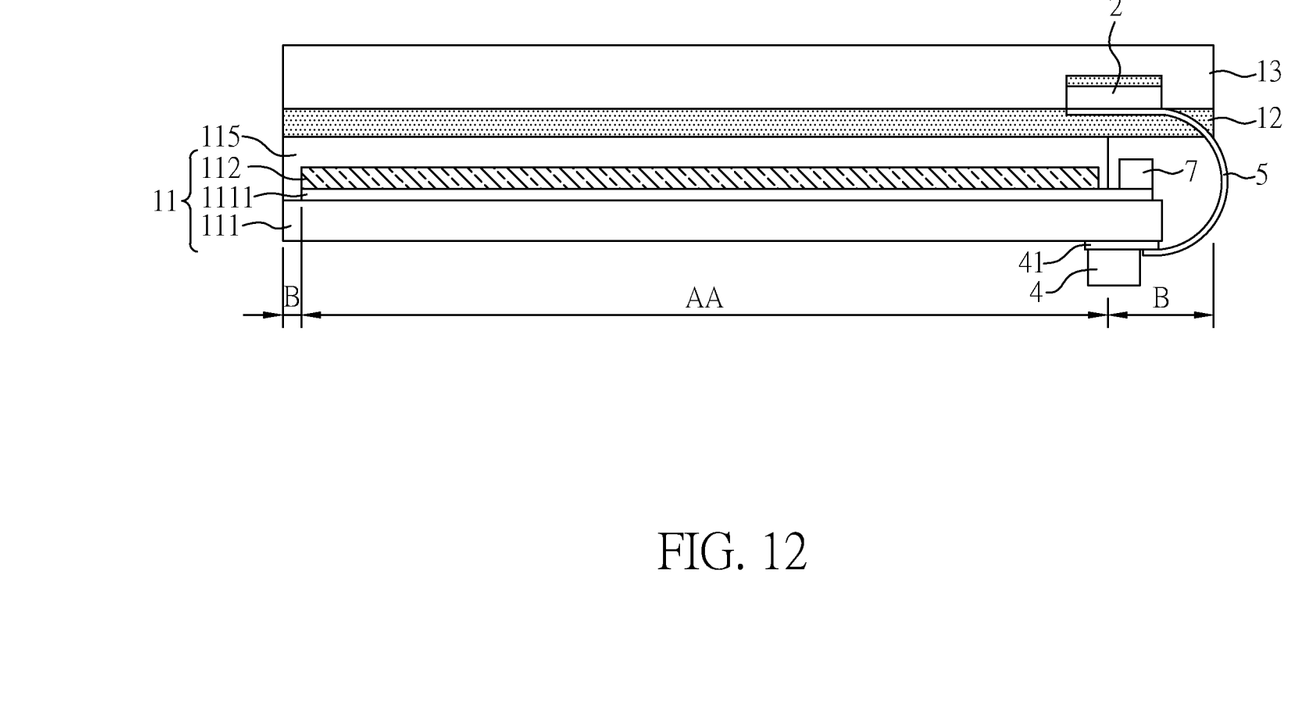
FIG. 12 is a cross-sectional view of a display apparatus according to Embodiment 12 of the present disclosure.

FIG. 12 is a cross-sectional view of a display apparatus according to the present embodiment. The structures of the display apparatuses of Embodiment 9 and the present embodiment are similar, except that the integrated circuit for driving the biometric sensor 2 is not shown in FIG. 9 but is shown in FIG. 12 and the positions of the biometric sensor 2 shown in FIG. 9 and FIG. 12 are different.

In the present embodiment, the display apparatus further comprises: an integrated circuit 4, disposed at a side of the display panel 11 opposite to the cover layer 13, wherein the integrated circuit 4 is electrically connected to the biometric sensor 2. The manner for electrically connecting the biometric sensor 2 and the integrated circuit 4 is similar to that shown in FIG. 10, and is not repeated again.

In addition, the integrated circuit 4 partially overlaps the display area AA, but the present disclosure is not limited thereto. Apart of the biometric sensor 2 overlaps the display area AA and the other part of the biometric sensor 2 overlaps the non-display area B, but the present disclosure is not limited thereto Furthermore, another integrated circuit 7 for driving the display panel 11 may be further disposed on the non-display area B of the active substrate 111. However, the present disclosure is not limited thereto, and the integrated circuit (not shown in the figure) for driving the display panel 10 and the integrated circuit 4 for driving the biometric sensor 2 can be integrated into one single integrated circuit.

Embodiment 13

Figure 13:
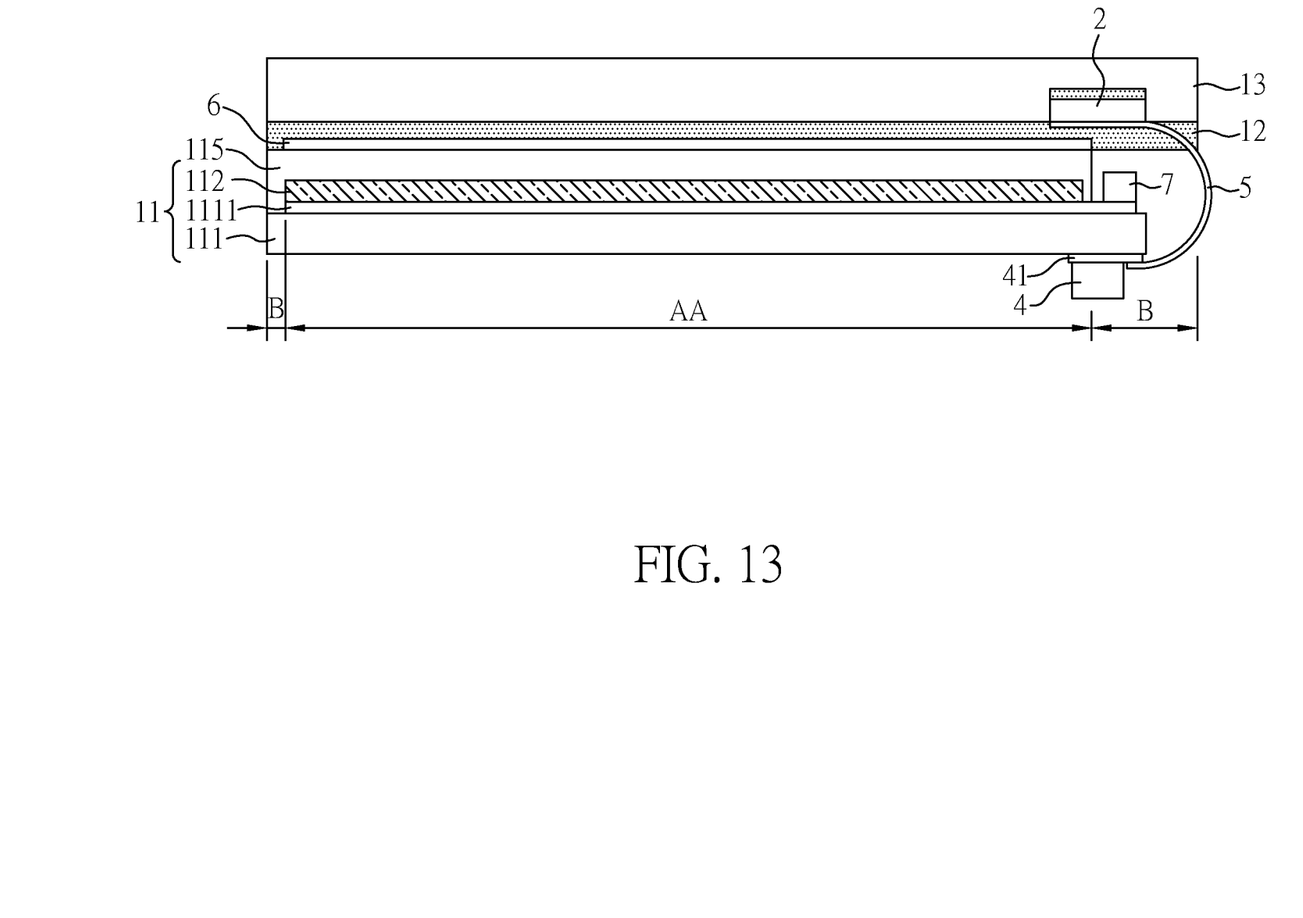
FIG. 13 is a cross-sectional view of a display apparatus according to Embodiment 13 of the present disclosure.

FIG. 13 is a cross-sectional view of a display apparatus according to the present embodiment. The structures of the display apparatuses of Embodiment 12 and the present embodiment are similar, except that the display apparatus of the present embodiment further comprises a touch layer.

In the present embodiment, the display apparatus further comprises a touch layer 6 disposed between the display panel 11 and the cover layer 13; thus the display apparatus is a touch display apparatus. In addition, at least a part of the biometric sensor 2 overlaps the touch layer 6.

In other embodiments of the present disclosure, the position of the touch layer 6 is not limited to that shown in FIG. 13. For example, the touch layer may be disposed on the active substrate 111, disposed on the inner side of the cover layer, or disposed on the outer side the cover layer 13.

Embodiment 14

Figure 14:
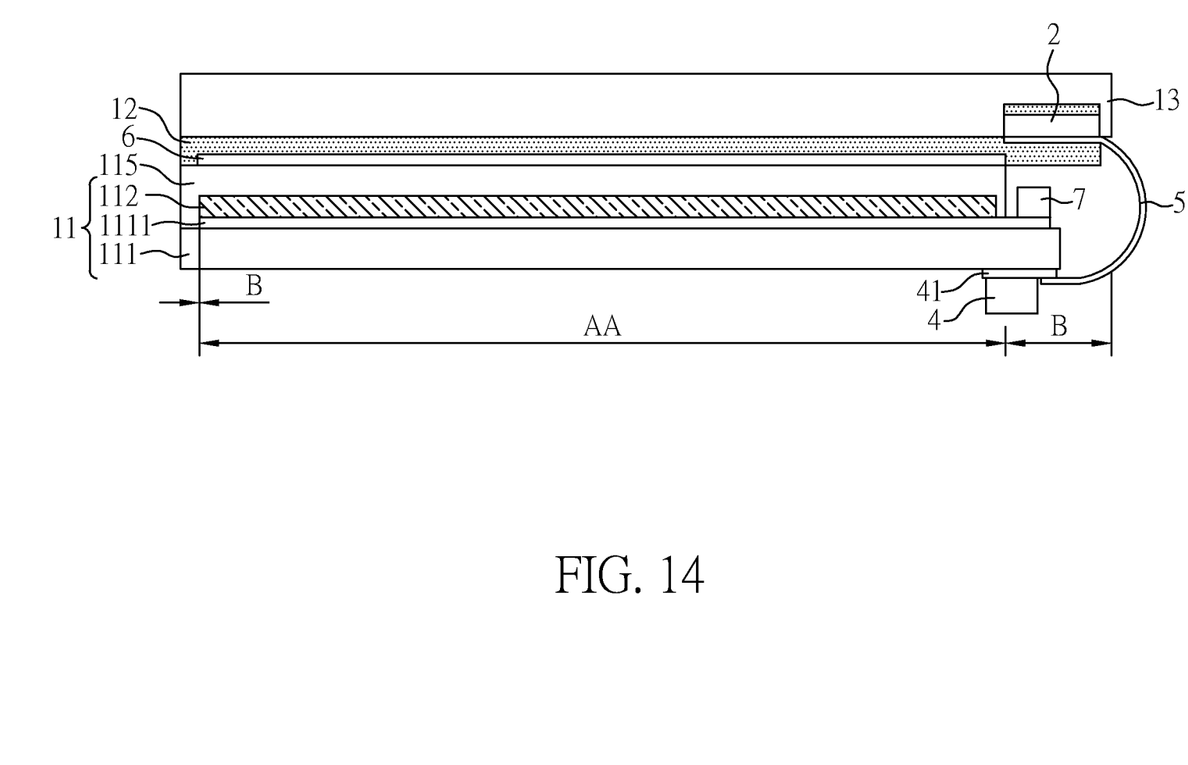
FIG. 14 is a cross-sectional view of a display apparatus according to Embodiment 14 of the present disclosure.

FIG. 14 is a cross-sectional view of a display apparatus according to the present embodiment. The structures of the display apparatuses of Embodiment 13 and the present embodiment are similar, except that the positions of the biometric sensors are different.

In the present embodiment, the touch layer 6 is disposed on the display area AA, and the biometric sensor 2 is disposed on the non-display area B. Thus, the biometric sensor 2 is located adjacent to the touch layer 6 without overlapping each other in a direction perpendicular to the active substrate 111.

In the aforementioned embodiments and other embodiments of the present disclosure, the biometric sensor may include a fingerprint sensor, an iris sensor, a retina sensor, a facial sensor, a vein sensor, a voice sensor, a motion sensor, a gesture sensor, or a DNA sensor.

Meanwhile, a display apparatus or touch display apparatus made as described in any of the embodiments of the present disclosure as described previously may be applied to any electronic devices known in the art that need a display screen, such as displays, mobile phones, laptops, video cameras, still cameras, music players, mobile navigators, TV sets, and other electronic devices that display images.

Meanwhile, the display apparatus or the electronic device may further comprise a signal source as a transmitter which emits a first signal such as ultrasound wave, electromagnetic wave, etc, to a user. The biometric sensor as a receiver may receive a second signal from the user. And then the second signal can be analyzed to acquire a biometric data of the user. An authentication method can be processed according to the biometric data to invoke a subsequent function. However, the present disclosure is not limited thereto.

Although the present disclosure has been explained in relation to its embodiment, it is to be understood that many other possible modifications and variations can be made without departing from the spirit and scope of the disclosure as hereinafter claimed.

What is claimed is:

1. A display apparatus, comprising:
a display panel including an active substrate, wherein the active substrate includes a display area and a non-display area adjacent to the display area;
a first adhesive layer disposed on the display panel;
a cover layer disposed on the first adhesive layer;
a biometric sensor disposed between the first adhesive layer and the cover layer;
an integrated circuit disposed at a side of the display panel opposite to the cover layer; and
a conductive adhesive layer;
wherein the integrated circuit is attached to the non-display area through the conductive adhesive layer.

2. The display apparatus of claim 1, wherein the first adhesive layer has a first thickness in a range from 10 μm to 200 μm.

3. The display apparatus of claim 1, wherein the cover layer includes a recess portion and at least a part of the biometric sensor is embedded in the recess portion.

4. The display apparatus of claim 3, wherein the cover layer has a second thickness corresponding to the recess portion and the second thickness is in a range from 30 μm to 300 μm.

5. The display apparatus of claim 3, wherein the cover layer includes a protruding portion corresponding to the recess portion, the protruding portion is disposed at a first side of the cover layer, the recess portion is disposed at a second side of the cover layer, and the first side is opposite to the second side.

6. The display apparatus of claim 1, further comprising a second adhesive layer disposed between the biometric sensor and the cover layer.

7. The display apparatus of claim 6, wherein the first adhesive layer has a first thickness, the second adhesive layer has a third thickness, and the third thickness is less than the first thickness.

8. The display apparatus of claim 6, wherein the first adhesive layer and the second adhesive layer respectively have a refractive index in a range from 1.41 to 1.51.

9. The display apparatus of claim 1, wherein the cover layer has a fourth thickness in a range from 30 μm to 300 μm.

10. The display apparatus of claim 1, wherein the integrated circuit is disposed on the non-display area and the integrated circuit is electrically connected to the biometric sensor.

11. The display apparatus of claim 1, wherein the biometric sensor overlaps the display area in a first direction perpendicular to the active substrate.

12. The display apparatus of claim 11, wherein the biometric sensor further overlaps the non-display area in the first direction.

13. The display apparatus of claim 1, wherein the display panel further includes a counter substrate disposed opposite to the active substrate, the non-display area includes a first region and a second region, the first region overlaps the counter substrate in a first direction perpendicular to the active substrate, and the second region does not overlap the counter substrate in the first direction.

14. The display apparatus of claim 13, wherein the biometric sensor overlaps the first region in the first direction.

15. The display apparatus of claim 14, wherein the biometric sensor further overlaps the second region in the first direction.

16. The display apparatus of claim 13, wherein the biometric sensor overlaps the second region in the first direction.

17. The display apparatus of claim 1, wherein the cover layer includes an extending portion which does not overlap the display panel in a second direction perpendicular to the cover layer and the biometric sensor is disposed on the extending portion.

18. The display apparatus of claim 1, wherein the biometric sensor comprises a fingerprint sensor, an iris sensor, a retina sensor, a facial sensor, a vein sensor, a voice sensor, a motion sensor, a gesture sensor, or a DNA sensor.

* * * * *